US010673207B2

(12) United States Patent
Dadgar et al.

(10) Patent No.: US 10,673,207 B2
(45) Date of Patent: Jun. 2, 2020

(54) LIGHT-EMITTING SEMICONDUCTOR DEVICE, LIGHT-EMITTING SEMICONDUCTOR COMPONENT AND METHOD FOR PRODUCING A LIGHT-EMITTING SEMICONDUCTOR DEVICE

(71) Applicant: OSRAM Opto Semiconductors GmbH, Regensburg (DE)

(72) Inventors: Armin Dadgar, Berlin (DE); André Strittmatter, Schwielowsee (DE); Christoph Berger, Magdeburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/579,162

(22) PCT Filed: Jun. 2, 2016

(86) PCT No.: PCT/EP2016/062523
§ 371 (c)(1),
(2) Date: Dec. 1, 2017

(87) PCT Pub. No.: WO2016/193385
PCT Pub. Date: Dec. 8, 2016

(65) Prior Publication Data
US 2018/0166854 A1    Jun. 14, 2018

(30) Foreign Application Priority Data

Jun. 4, 2015   (DE) ........................ 10 2015 108 876

(51) Int. Cl.
*H01S 5/183*   (2006.01)
*H01S 5/30*    (2006.01)
(Continued)

(52) U.S. Cl.
CPC ...... *H01S 5/18361* (2013.01); *H01L 33/0045* (2013.01); *H01L 33/025* (2013.01);
(Continued)

(58) Field of Classification Search
CPC ... H01S 5/18361; H01S 5/3077; H01L 33/105
See application file for complete search history.

(56) References Cited

U.S. PATENT DOCUMENTS

| 5,757,837 A | 5/1998 | Lim et al. |
| 2002/0030198 A1 | 3/2002 | Coman et al. |

(Continued)

OTHER PUBLICATIONS

Cosendey, G. et al.: "Blue monolithic AlInN-based vertical cavity surface emitting laser diode on free-standing GaN substrate" Applied Physics Letters; vol. 101; Issue 15; 151113, Oct. 2012.
Carlin, J. F. et al.: "High-efficiency top-emitting microcavity LEDs on GaAs and GaAs/Si substrates" Journal for Crystal Growth; Elsevier Science B.V.; vol. 201-202; ISSN: 0022-0248; May 1, 1999; pp. 994-998.
(Continued)

*Primary Examiner* — Tod T Van Roy
(74) *Attorney, Agent, or Firm* — MH2 Technology Law Group, LLP

(57) ABSTRACT

The invention relates to, inter alia, a light-emitting semiconductor component comprising the following: —a first mirror (102, 202, 302, 402, 502), —a first conductive layer (103, 203, 303, 403, 503), —a light-emitting layer sequence (104, 204, 304, 404, 504) on a first conductive layer face facing away from the first mirror, and—a second conductive layer (105, 205, 305, 405, 505) on a light-emitting layer sequence face facing away from the first conductive layer, wherein—the first mirror, the first conductive layer, the light-emitting layer sequence, and the second conductive layer are based on a III-nitride compound semiconductor material, —the first mirror is electrically conductive, and— the first mirror is a periodic sequence of homoepitaxial materials with varying refractive indices.

6 Claims, 7 Drawing Sheets

Figure 5B:
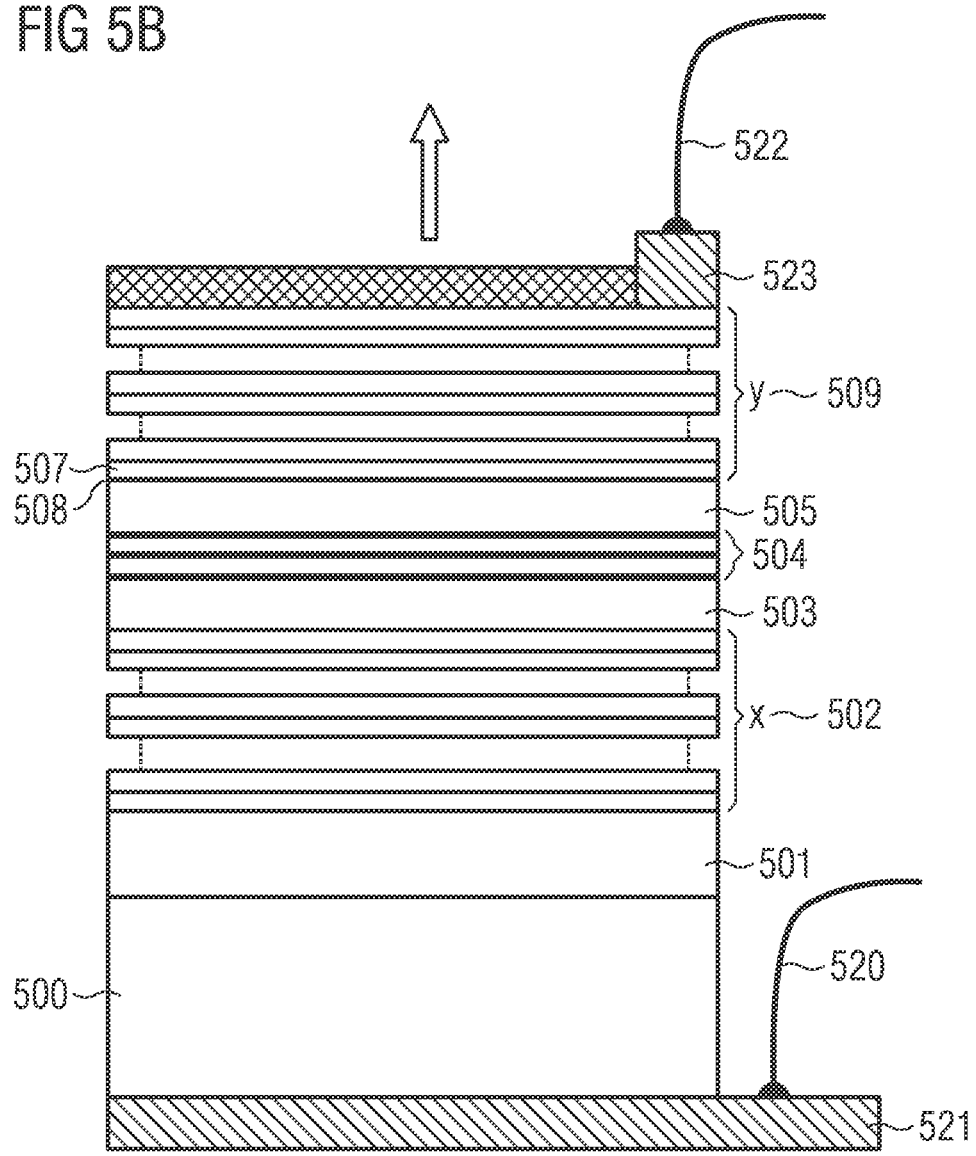

(51) Int. Cl.
*H01L 33/00* (2010.01)
*H01L 33/10* (2010.01)
*H01L 33/32* (2010.01)
*H01L 33/02* (2010.01)
*H01L 33/30* (2010.01)
*H01S 5/343* (2006.01)
*H01S 5/00* (2006.01)
*H01L 33/08* (2010.01)
*H01L 33/50* (2010.01)
*H01S 5/042* (2006.01)

(52) U.S. Cl.
CPC ............ *H01L 33/10* (2013.01); *H01L 33/105* (2013.01); *H01L 33/32* (2013.01); *H01S 5/18302* (2013.01); *H01S 5/18386* (2013.01); *H01S 5/3077* (2013.01); *H01S 5/3095* (2013.01); *H01L 33/08* (2013.01); *H01L 33/305* (2013.01); *H01L 33/502* (2013.01); *H01S 5/005* (2013.01); *H01S 5/042* (2013.01); *H01S 5/305* (2013.01); *H01S 5/3013* (2013.01); *H01S 5/34333* (2013.01)

(56) References Cited

U.S. PATENT DOCUMENTS

| | | | |
|---|---|---|---|
| 2005/0030999 A1* | 2/2005 | Yoneda | B82Y 20/00 372/46.01 |
| 2006/0215720 A1* | 9/2006 | Corzine | B82Y 20/00 372/50.11 |
| 2011/0116520 A1* | 5/2011 | Krijn | H01S 5/005 372/29.02 |
| 2014/0072812 A1* | 3/2014 | Hamada | H01S 5/02296 428/432 |
| 2015/0303655 A1* | 10/2015 | Han | H01S 5/34333 372/45.012 |
| 2016/0301189 A1* | 10/2016 | Cable | G01B 9/02091 |
| 2017/0237234 A1* | 8/2017 | Han | H01L 33/32 372/45.012 |

OTHER PUBLICATIONS

Feneberg, M. et al.: "Band gap renormalization and Burstein-Moss effect in silicon- and germanium-doped wurtzite GaN up to 1020 cm-3" American Physical Society; Physical Review B 90; Aug. 18, 2014; pp. 075203-1-375203-10.

* cited by examiner

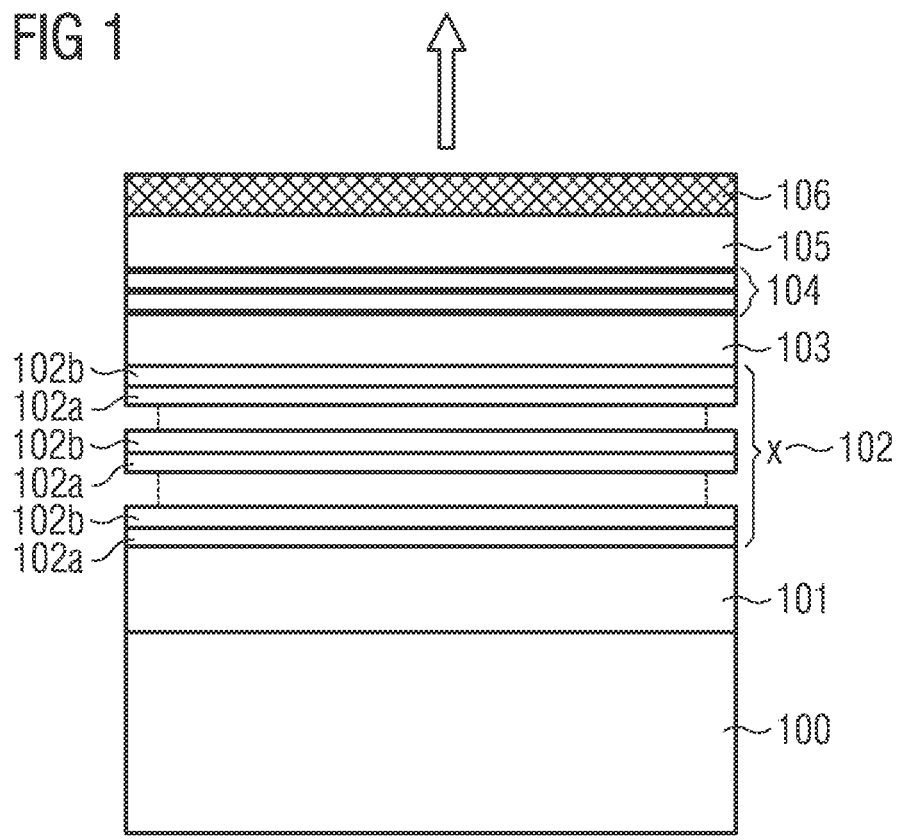

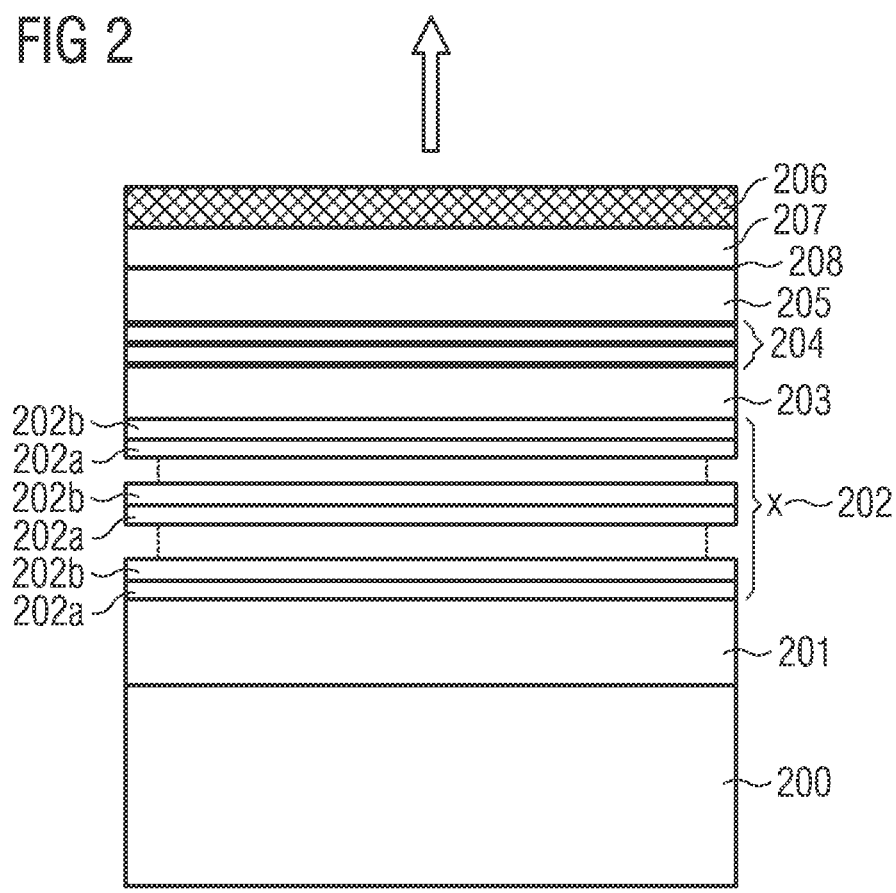

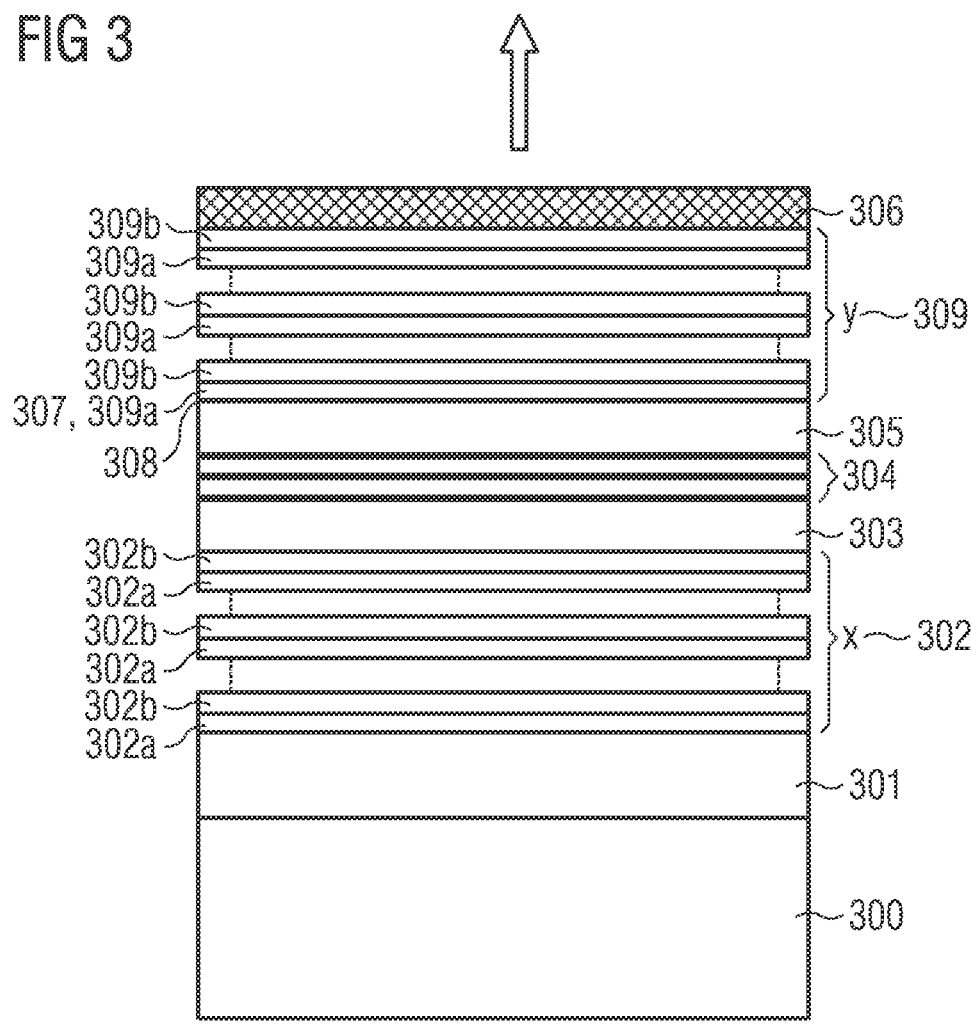

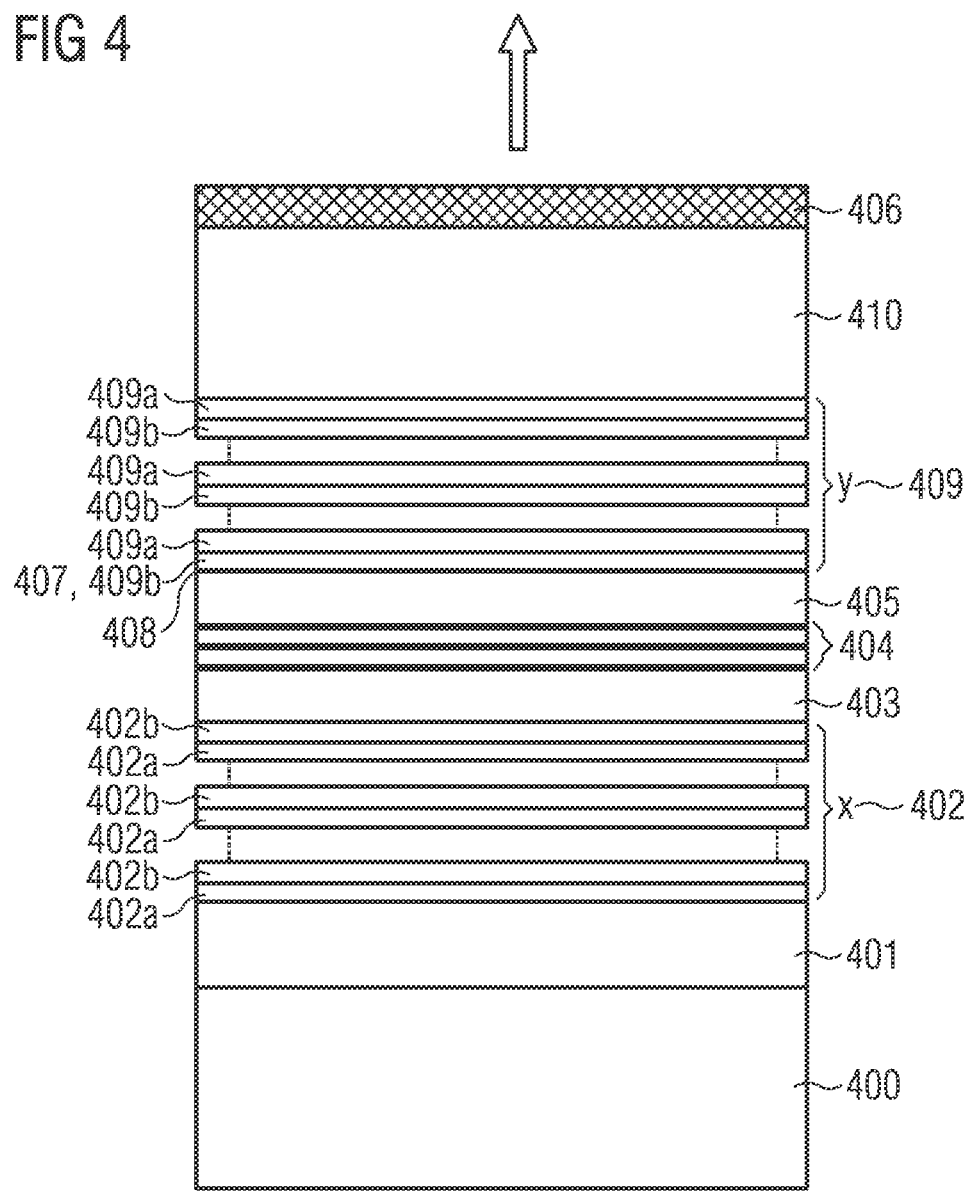

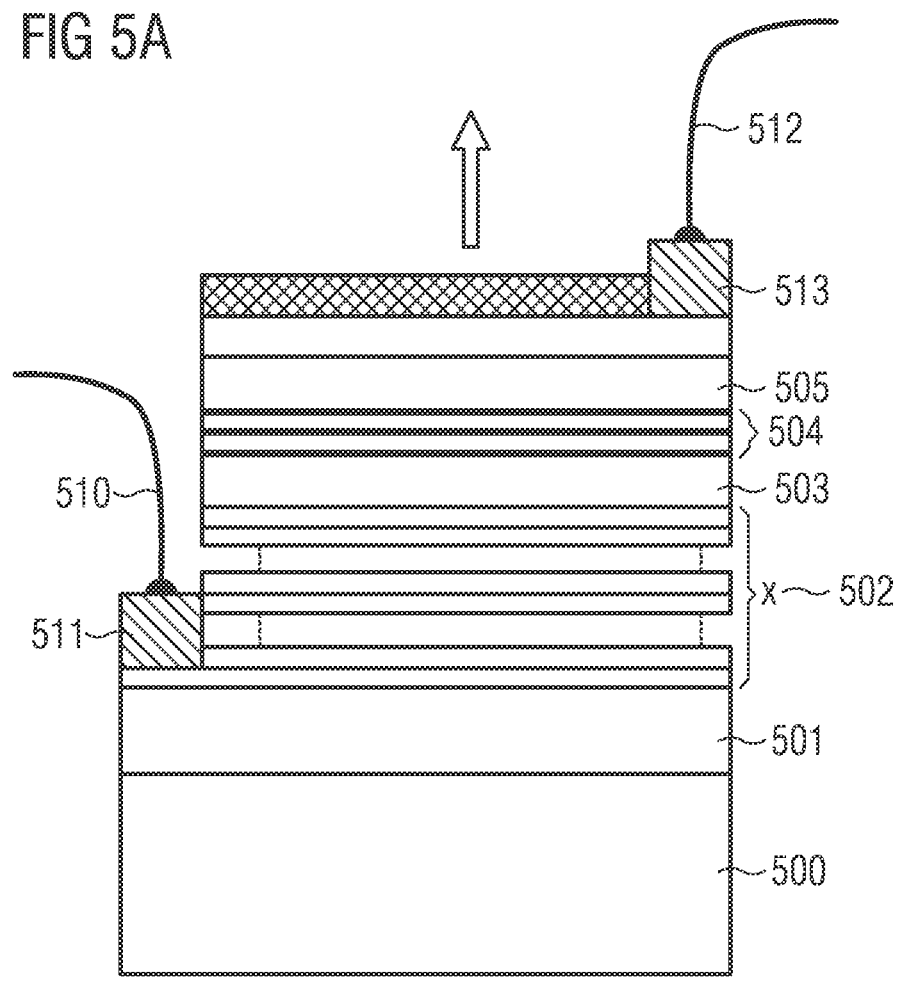

LIGHT-EMITTING SEMICONDUCTOR DEVICE, LIGHT-EMITTING SEMICONDUCTOR COMPONENT AND METHOD FOR PRODUCING A LIGHT-EMITTING SEMICONDUCTOR DEVICE

A light-emitting semiconductor device, a light-emitting semiconductor component and a method for producing a light-emitting semiconductor device are provided.

One object to be achieved consists in creating an improved light emitter with directional, narrow-band emission for generating white light or narrow-band, visible light. A further object to be achieved consists in providing a light-emitting semiconductor component comprising such a light emitter. A further object to be achieved consists in providing a method with which such a light emitter may be produced particularly inexpensively.

The light-emitting semiconductor device is for example a light-emitting diode chip, a laser diode chip or a superluminescent diode chip. During operation of the light-emitting semiconductor device, electromagnetic radiation in the region of the spectrum between UV radiation and infrared radiation, in particular visible light, is generated in the light-emitting semiconductor device.

According to at least one embodiment of the light-emitting semiconductor device, the semiconductor device comprises a first mirror. The first mirror is configured to reflect light generated in the light-emitting semiconductor device during operation with a specific reflectivity. The reflectivity of the first mirror for example amounts to at least 50%, preferably at least 75%, in particular at least 90%.

According to at least one embodiment of the light-emitting semiconductor device, the semiconductor device comprises a first conductive layer. The first conductive layer is, for example, a semiconductor layer which may be n- or p-doped. The first conductive layer may in particular also be a sequence of a plurality of layers which are arranged directly above one another in a growth direction and have the same conductivity type.

According to at least one embodiment of the light-emitting semiconductor device, the semiconductor device comprises a light-emitting layer sequence. The light-emitting layer sequence is the active region of the light-emitting semiconductor device, in which the light emitted by the light-emitting semiconductor device is generated during operation of the light-emitting semiconductor device. The light-emitting layer sequence for example comprises at least one layer, preferably a multiplicity of layers. The light-emitting layer sequence may for example take the form of a pn-junction, a double heterostructure, a single quantum well structure or in particular a multiple quantum well structure. The light-emitting layer sequence is here arranged on a side of the first conductive layer remote from the first mirror.

According to at least one embodiment of the light-emitting semiconductor device, the semiconductor device comprises a second conductive layer on a side of the light-emitting layer sequence remote from the first conductive layer. The second conductive layer is a p- or n-doped layer. The second conductive layer here has the opposite conductivity type from the first conductive layer. The second conductive layer may also comprise a plurality of layers, which are arranged directly above one another in a growth direction and all have the same conductivity type.

For example, the first conductive layer is n-doped and the second conductive layer is p-doped.

According to at least one embodiment of the light-emitting semiconductor device, the first mirror, the first conductive layer, the light-emitting layer sequence and the second conductive layer are based on a III-nitride compound semiconductor material. That is to say, in addition to the conductive layers and the light-emitting layer sequence, the first mirror is also formed with a semiconductor material, specifically in the same material system as the stated layers.

According to at least one embodiment of the light-emitting semiconductor device, the first mirror is electrically conductive. That is to say, current can be injected in particular into the light-emitting layer sequence via the first mirror. In other words, no through-vias through the first mirror are required, instead the first mirror already per se exhibits electrical conductivity which is in particular suitable and configured to enable current feed to the light-emitting layer sequence for proper use of the light-emitting semiconductor device.

According to at least one embodiment of the light-emitting semiconductor device, the first mirror is a periodic sequence of homoepitaxial materials with a differing refractive index. That is to say, the first mirror comprises a plurality of mirror layers which differ from one another with regard to the refractive index thereof. The mirror layers here take the form of a periodic sequence of homoepitaxial materials. The mirror layers of the first mirror thus do not differ with regard to the III-nitride compound semiconductor material used, but are instead grown homoepitaxially over one another. In other words, except in terms of doping, the material composition of the mirror layers of the first mirror does not differ.

According to at least one embodiment of the light-emitting semiconductor device, a light-emitting semiconductor device is provided having
 a first mirror,
 a first conductive layer,
 a light-emitting layer sequence on a side of the first conductive layer remote from the first mirror, and
 a second conductive layer on a side of the light-emitting layer sequence remote from the first conductive layer, wherein
 the first mirror, the first conductive layer, the light-emitting layer sequence and the second conductive layer are based on a III-nitride compound semiconductor material,
 the first mirror is electrically conductive, and
 the first mirror is a periodic sequence of homoepitaxial materials with a differing refractive index.

The first mirror, the first conductive layer, the light-emitting layer sequence and the second conductive layer are here arranged above one another along a stack direction. In particular, it is possible for the layers to directly succeed one another in the stated sequence and to be arranged adjacent one another.

Light emitters based on group III-nitrides serve as the basis of LED light sources, headlamps and as blue to green lasers inter alia for Blu-Ray players and laser-based projection. In particular when generating white light, the approach these days is usually to start from a blue LED and a phosphor. Alternatively, white light may also be generated by a suitable combination of three or more LEDs with narrow-band emission in the blue, green and red wavelength ranges. The latter method, however, allows light to be generated which is only poorly suited to lighting purposes. The quasi-continuous spectrum which can be generated with the assistance of phosphors is thus preferred.

In addition to the generation of white light, the production of inexpensive, narrow-band light sources at other wavelengths of the visible and ultraviolet regions of the spectrum is in principle of interest. This is of importance for example for applications in biological and chemical analysis and diagnostics, where using complex and therefore costly lasers is frequently a limiting factor on the widespread use of the latest technology. Furthermore, projection techniques in which a high-performance green light source could be achieved by efficient color conversion of blue to green are conceivable. Using nitride-based light emitters, this has hitherto only been possible in association with severe losses.

The phosphors used for generating white or longer-wave light usually have a high conversion efficiency only over a narrow wavelength range of the exciting light. White light sources which use narrow-band light sources as the primary excitation source, the emission spectrum of which is precisely tuned to these excitation wavelengths, thus inherently have a higher efficiency. It is therefore desirable to manufacture such narrow-band primary light sources as simply and reliably as possible.

Light-emitting nitride layers, for example indium gallium nitride, however, have only very wide-band emission spectra due to their material properties. The emission from corresponding light-emitting diodes (LEDs) is accordingly much wider than the excitation spectrum of the phosphors for conversion into white light. In addition, due to the particular material properties of nitrides, the emission of the LEDs shifts strongly with electrical current density. By embedding the LED structure in a resonator made up of two mirrors, it is in principle possible to achieve narrow-band, directional emission. In semiconductor technology, such mirrors can be produced by applying a periodic sequence of layer pairs, wherein the layers must have different refractive indices and a layer thickness adapted to the respective refractive index.

Such mirrors are generally denoted Bragg-mirrors. They are preferably used in the production of vertically emitting laser and light-emitting diodes which permit particularly small dimensions and therefore compact configurations. Important criteria for selecting the materials for Bragg-mirrors in semiconductor devices are electrical conductivity and lattice adaptation to surrounding layers and in particular to the substrate. At present, the main problems of nitride-based Bragg-mirrors reside both in the strain in the system, which can lead to buckling of the substrate or even tearing of the grown layers, and in the electrical conductivity of such mirrors.

While it is indeed possible to use lattice-adapted GaN/AlInN layers for producing the mirrors, this system entails long growth times, since numerous extreme temperature changes and slow growth rates are essential for good layer properties of AlInN. In this system too, inherently high electronic barriers are present at the interfaces, which result in reduced electrical conductivity.

Instead of combining various materials together in order to achieve corresponding differences in refractive index, use is made in the present case of the consideration that such an effect can also be achieved by a high level of doping with a foreign atom which is very readily soluble in the crystal. By doping with "donors", it is possible to bring about a lasting increase in the electron density in the conduction band of the semiconductor. At very high doping rates, a "Burstein-Moss shift" in the band gap towards higher energies may occur. This also has a direct effect on the refractive index, which is reduced in the doped material in comparison with the same, but undoped or only slightly doped, material. This refractive index difference is generally smaller than for heterogeneous materials. As a result, a periodic sequence of highly and lowly doped layers gives rise to Bragg-mirrors with narrow-band increased reflection.

Light-emitting diodes in the visible region of the spectrum made from nitride semiconductors achieve distinctly higher luminous efficacy than laser diodes, which are additionally distinctly more complicated to produce. While for general lighting purposes a spatially isotropic emission pattern is advantageous, directional light emission is, however, desired for many applications.

For example, in order to achieve improved lighting specifically over large distances, laser-based light sources are now also being used for full beam in motor vehicles. In this case, a luminescence converter is illuminated with a blue laser and the emission thereof, together with the laser emission, mixes to give rise to a punctiform, white light source which, by means of image-forming optical systems, has a directional emission pattern and so generates a bright spot of light over large distances. The lasers used are "edge emitters", in which light is outcoupled via facets produced laterally in the semiconductor material. This has the disadvantage that the beam of light is highly asymmetrical and rapidly diverges in one direction with increasing distance. Imaging onto the smallest possible, intense spot of light is thus a problem.

While this problem can indeed by remedied by specifically adapted lens systems, this results in high manufacturing costs and greater susceptibility to faults. In addition to the previously used edge emitters, vertical lasers are in principle also conceivable, in which light is outcoupled via the surface of the semiconductor substrate. Since the light outcoupling face may on the one hand very straightforwardly be produced with radial symmetry, such surface emitters have an ideal beam profile and require no correcting optical systems. However, in order to achieve laser activity, such lasers require highly reflective mirrors which are preferably produced from Bragg-mirrors of crystallographically adapted materials. Since the refractive index differences are low and strain high in the group III-nitride system, producing such surface emitters is particularly difficult. To date, there have only been optically pumped or pulsed electrically pumped vertically emitting lasers, typically based on lattice-adapted AlInN and GaN, in which the above-stated problems of growth and electrical conductivity subsist [Cosendey et al., Applied Physics Letters 101, 151113 (2012)].

It has surprisingly now been found that a mirror can be formed in the III-nitride compound semiconductor material system by a periodic sequence of homoepitaxial materials with a differing refractive index. This mirror advantageously brings about little or no strain in the light-emitting semiconductor device and may be of electrically conductive construction. Using the mirror, it is possible to produce light-emitting semiconductor devices such as light-emitting diodes, superluminescent diodes or laser diodes which emit light of high beam quality through a major face.

According to at least one embodiment of the light-emitting semiconductor device, the first mirror is a periodic sequence of high-refractive-index mirror layers and low-refractive-index mirror layers, wherein the high-refractive-index mirror layers and the low-refractive-index mirror layers differ from one another by the concentration of a dopant. In particular, the high-refractive-index mirror layers and the low-refractive-index mirror layers are formed in the same material system and, except from the different concentration of dopant, have the same material composition. The different refractive index of the low-refractive-index mirror layers and the high-refractive-index mirror layers is established by the different concentration of the dopant in the layers.

The low-refractive-index and the high-refractive-index mirror layers here preferably alternate regularly and are arranged directly on one another.

According to at least one embodiment of the light-emitting semiconductor device, the high-refractive-index mirror layers and the low-refractive-index mirror layers comprise the same dopant. The dopant concentration is here for example higher in the low-refractive-index mirror layers than in the high-refractive-index mirror layers. The difference in refractive index between the different mirror layers is explained by the difference in dopant concentration. The refractive index difference between the low-refractive-index mirror layers and the high-refractive-index mirror layers may here amount to at least 1%, in particular at least 2%. The sequence of low-refractive-index and high-refractive-index mirror layers, each comprising the dopant, forms an electrically conductive Bragg-mirror.

For example, the high-refractive-index mirror layers are nominally undoped and, during production of the mirror, the dopant is introduced only into the low-refractive-index mirror layers. The dopant may then diffuse out of the low-refractive-index mirror layers into the adjacent high-refractive-index mirror layers.

According to at least one embodiment of the light-emitting semiconductor device, the dopant in the high-refractive-index mirror layers and the low-refractive-index mirror layers is tin or germanium.

The mirror layers of the first mirror may here in particular be based on the III-nitride compound semiconductor materials GaN or AlInGaN. The dopants tin and germanium are donors for the stated material system and result in n-doping of the mirror layers, such that the first mirror is overall n-conductive.

Germanium in particular has proven to be a particularly highly suitable dopant for forming mirror layers with a differing optical refractive index. Unlike for example silicon as dopant, when using germanium as dopant it is also possible to achieve a high dopant concentration of greater than $10^{19}$ per cubic centimeter when producing the light-emitting semiconductor device in a MOVPE reactor without unwanted roughening of the doped layers occurring. In contrast thereto, doping with silicon as n-dopant during MOVPE growth can lead at high dopant concentrations to unwanted roughening of the doped layers, which may in particular complicate production of a mirror with layers which are clearly delimited from one another.

According to at least one embodiment of the light-emitting semiconductor device, the low-refractive-index mirror layers have a dopant concentration of at least $2\times10^{19}$ cm$^{-3}$ and the high-refractive-index mirror layers have a dopant concentration of less than $1\times10^{19}$ cm$^{-3}$. In particular, the low-refractive-index mirror layers have a dopant concentration of at least $8\times10^{19}$ cm$^{-3}$ and the high-refractive-index mirror layers a dopant concentration of at most $5\times10^{18}$ cm$^{-3}$.

In particular when using germanium as dopant, it has also proven surprisingly advantageous for the dopant concentration for the high-refractive-index mirror layers to amount to at least $10^{18}$ cm$^{-3}$.

That is to say, a certain concentration of dopant is also advantageous for the high-refractive-index mirror layers. On the one hand, this ensures that the first mirror has sufficient electrical conductivity to feed current to the light-emitting layer sequence through the first mirror during operation. On the other hand, it has been found that in particular for germanium as dopant, the refractive index has a maximum in the order of a dopant concentration of $10^{18}$ cm$^{-3}$, such that a particularly high refractive index difference between the mirror layers of the mirror can be achieved.

According to at least one embodiment of the light-emitting semiconductor device, a further dopant which differs from the dopant is introduced at an interface between a low-refractive-index mirror layer and a high-refractive-index mirror layer. If the dopant is, for example, tin or germanium, the further dopant may in particular be silicon. The further dopant is for example introduced into the low-refractive-index mirror layer at the interface between a low-refractive-index mirror layer and a high-refractive-index mirror layer.

In particular, the further dopant may be introduced at high concentration, but only in a small region of the low-refractive-index mirror layer.

In particular, the further dopant may be introduced in such a manner that at most a monolayer of the further dopant is present between the low-refractive-index layer and the high-refractive-index layer. The further dopant may, for example, be introduced as so-called Delta-doping. To this end, growth of the mirror is interrupted during production in order to apply at most a monolayer, in particular at most half a monolayer, of the dopant.

In particular when using silicon as the further dopant, this may impede or prevent any unwanted diffusion of the dopant between the different mirror layers. In this manner it is possible to establish the dopant concentration in the mirror layers with a different optical refractive index particularly precisely and in particular to impede subsequent diffusion processes during production or operation.

According to at least one embodiment of the light-emitting semiconductor device, the light-emitting semiconductor device comprises a second mirror on a side of the second conductive layer remote from the light-emitting layer sequence. The second mirror may here be formed with one of the following materials: semiconductor, insulator, metal.

Together with the first mirror, the second mirror can form a resonator for the light generated in the light-emitting layer sequence. The light-emitting semiconductor device may then in particular be a laser or a superluminescent diode. The light-emitting semiconductor device may for example then be an electrically pumped vertically emitting laser.

The second mirror may for example take the form of a metal mirror. In this case, the light generated during operation of the light-emitting semiconductor device is outcoupled through the first mirror. The second mirror may furthermore be a dielectric mirror which is formed with an insulator. The dielectric mirror is then for example an electrically insulating Bragg-mirror. The light generated during operation may then be outcoupled through the first or the second mirror. Finally, the second mirror may, like the first mirror, be formed by a semiconductor material.

The second mirror may in particular also be an n-conductive semiconductor mirror which, possibly apart from the number of mirror layers, may be of identical construction to the first mirror. A tunnel contact between the second mirror and the second conductive layer may be present for connection of the second mirror, the tunnel contact permitting electrically conductive connection to the p-side of the light-emitting device via the n-conductive second mirror. A highly doped and thus low-refractive-index mirror layer may form the highly n-doped layer of the tunnel contact.

According to at least one embodiment of the light-emitting semiconductor device, the second mirror is of similar construction to the first mirror, wherein the second mirror comprises a smaller number of mirror layers than the first mirror and the reflectivity of the second mirror is lower than the reflectivity of the first mirror. In this embodiment, the mirror layers of the second mirror may correspond in composition to the mirror layers of the first mirror. Outcoupling proceeds through the second mirror, for which purpose the latter has a lower reflectivity than the first mirror. The lower reflectivity of the second mirror may for example be achieved by a reduction in the mirror layers. All the features described for the first mirror are likewise disclosed for the second mirror.

According to at least one embodiment, a light-emitting group III-nitride-based device is provided, comprising
a) a resonator with at least one mirror coating produced by epitaxy of a periodic sequence of homoepitaxial materials with a differing refractive index,
b) a light-emitting group III-nitride layer or layer sequence
c) at least one substance which at least partially converts the luminescence of the group III-nitride layer and/or further group III-nitride layer.

A sequence of low- or high-refractive-index homoepitaxial materials is for example taken to mean a so-called Bragg-mirror or resonator.

One embodiment provides a light-emitting group III-nitride-based device, characterized by a resonator, in which the refractive index difference of the group III-nitride layers is achieved by modifying doping and here has doping of over $2 \times 10^{19}$ cm$^{-3}$, preferably over $8 \times 10^{19}$ cm$^{-3}$, and a lower doping of below $1 \times 10^{19}$ cm$^{-3}$, preferably below $5 \times 10^{18}$ cm$^{-3}$, for the respectively differently refractive layers.

In this way it is possible to achieve a refractive index difference which for example in GaN amounts to approx. 1-2%.

A further embodiment provides a light-emitting group III-nitride-based device, characterized by an additional highly reflective mirror coating on the surface of the group III-nitride layers, which has a spectral bandwidth greater than the emission bandwidth of the light-emitting group III-nitride layer or group III-nitride layer sequence and the center wavelength of which corresponds to the wavelength to be emitted.

A highly reflective mirror coating is here a mirror coating, preferably a Bragg-mirror with a reflectivity of at least 50%, better 75% and ideally over 90%.

The spectral bandwidth is here the wavelength interval or energy interval which a measurement signal scans at half maximum intensity. Similarly, the emission bandwidth is the wavelength interval or energy interval which an emission measurement signal of the light emitter scans at half maximum intensity. The center wavelength is here the unweighted central value which is obtained from the half maximum intensity of the bandwidth.

Homoepitaxial, highly reflective Bragg-mirrors are thus possible which have high electrical conductivity and minimal strain and may additionally be produced using identical or only slightly differing growth parameters.

The light-emitting layer of the semiconductor structure is ideally located at a distance from the lower, first mirror which approximately corresponds to an uneven multiple of a quarter of the wavelength of the light to be emitted.

In order to ensure good vertical conductivity via the mirror and a maximum refractive index difference, a doping value of $5 \times 10^{17}$ cm$^{-3}$ to $2 \times 10^{18}$ charge carriers per cm$^3$ is advantageous for the lowly-doped mirror layer, since it is at this doping level that the refractive index difference between lowly and highly-doped mirror layers is at its greatest and sufficient conductivity in the lowly-doped layer is simultaneously achieved.

The layer thicknesses here ideally, but not necessarily, have an optical layer thickness which corresponds to a quarter of the stated light wavelength of the device in the semiconductor material. In the group III-nitride system, such thicknesses are in each case 30-80 nm. That is to say, according to at least one embodiment, the thickness of a mirror layer of the first and/or second mirror preferably amounts to at least 30 nm and at most 80 nm. For simple light emitters, all that is important is that the layers always have a maximally constant thickness and the total thickness of two adjacent layers corresponds to half the light wavelength. To ensure maximum reflectivity of a mirror at a specified maximum thickness of the Bragg-mirror, it is advantageous to ensure that the layer thicknesses comply as accurately as possible with one quarter of the stated light wavelength.

Particularly high mirror reflectivities approaching 100% are advantageous for an embodiment as a vertically emitting laser which permits particularly narrow-band, particularly highly directional emission. The required large number of layers in the Bragg-mirror is problematic in the case of heterogeneous layers in the nitride material system since not only the multiplicity of interfaces and the strain in lattice mismatched layers but also the different growth parameters have a limiting effect. In contrast, the embodiment of the Bragg-mirror described here eliminates these limitations by alternating doping levels.

This also gives rise to an advantage for production on foreign substrates, since the defect density which generally occurs in this case can be effectively reduced over the layer thickness. As a consequence, such lasers may thus achieve an increased service life even on more inexpensive substrates. Possible substrates are sapphire, silicon, SiC or group III-nitride pseudosubstrates, in particular even with a relatively high dislocation density and therefore relatively low price. When silicon is used, further Al-containing layers must be introduced for managing stress, for which reason the n-contact is ideally located above the final strain-regulating layer.

According to at least one embodiment, a light-emitting semiconductor device is provided in which, thanks to an additional wide-band mirror coating on the top of the device, particularly narrow-band emission of the light source is achieved, since the emission of non-resonant light wavelengths towards the surface is suppressed.

Embodying the Bragg-mirror in the described manner and the vertically emitting configuration of the device ensure improved efficiency of light generation and improved directional characteristics. As a consequence, many lighting applications in which a directional beam or cone of light is necessary or advantageous can be more simply, reliably and thus also more inexpensively achieved. Thanks to the directional characteristics, additional reflectors can be omitted, so simplifying luminaire design. Use in projectors with higher efficiency is additionally possible.

The invention is described below with reference to figures and exemplary embodiments. The latter may also be applied in combination.

A light-emitting component is further provided. The light-emitting component comprises at least one light-emitting semiconductor device as is described herein. That is to say, all the features disclosed for the light-emitting semiconductor device are also disclosed for the light-emitting component and vice versa. The light-emitting component furthermore comprises a converter which is arranged downstream of the at least one light-emitting semiconductor device. The converter may to this end for example contain or consist of a luminescence conversion material.

Converter layers or materials which may be considered, in addition to phosphors as are for example already today used in LED applications, also include optically pumped group III-nitride layers such as multiple quantum wells (MQWs) or frequency multiplication materials.

The luminescence conversion material may be a luminescence conversion material which is formed with a ceramic material or a semiconductive material. That is to say, the converter may for example comprise particles of a ceramic luminescence conversion material which are introduced into a matrix material such as for example silicone or epoxy resin. It is furthermore possible for the converter to consist of a ceramic luminescence conversion material. It is furthermore possible for the converter to be formed as a semiconductor layer or semiconductor layer sequence, which may for example likewise be based on a III-nitride compound semiconductor material. The converter may then also be integrated as an epitaxially grown layer into the layer stack of the light-emitting semiconductor device.

According to at least one embodiment of the light-emitting component, there is a distance between the at least light-emitting semiconductor device and the converter. The distance may for example take the form of a cavity which is filled with a gas such as for example air. It is furthermore possible for the distance to be formed with a plastics material such as silicone or epoxy resin. In other words, the converter may in this embodiment be arranged as a "remote phosphor" element downstream of the light-emitting semiconductor device.

The converter may be provided for full conversion of light generated in the light-emitting component. In this case, the great majority, in particular at least 90%, of the emitted light is converted by the converter into light of another wavelength. It is furthermore possible for the converter to be provided for producing mixed light obtained by blending converted light and the light primarily generated by the semiconductor device. The semiconductor part may then for example emit white mixed light when in operation.

A method for producing a light-emitting device is furthermore provided. The method may be used in particular to produce a light-emitting device as described herein. That is to say, all the features disclosed for the light-emitting device are also disclosed for the method and vice versa.

According to the method, the low-refractive-index mirror layers and the high-refractive-index mirror layers of the first mirror and/or second mirror are produced by homoepitaxial growth. That is to say, the mirror layers are grown on one another epitaxially, for example in a MOVPE installation, wherein the material compositions of the mirror layers do not differ from one another except in terms of doping, such that the first mirror and/or the second mirror may be produced by homoepitaxial growth. The low-refractive-index mirror layers and the high-refractive-index mirror layers may then be doped, for example during growth, with the dopant to establish the refractive index of the mirror layers.

If the dopant is germanium, it is for example provided in the form of germane in a hydrogen solution. The germanium is, for example, provided as 10% germane in hydrogen. Doping with germanium may then be carried out under an ammonia atmosphere. Doping here proceeds at a relatively high temperature of at least 1050° C., this being assumed to be the actual temperature of the surface on which the mirror layers are epitaxially deposited. That is to say, the stated temperature is not an average temperature which prevails in the epitaxy chamber but instead the temperature which is measured on the growth surface. The temperature here preferably amounts to at least 1050° C. and preferably at most 1060° C. It has surprisingly been found that such a relatively high growth temperature is ideal in order to achieve a sufficiently high level of doping in particular in the low-refractive-index mirror layers.

According to at least one embodiment of the method, the dopant is added only during growth of the low-refractive-index mirror layers. That is to say, the dopant is purposefully added from outside only during production of the low-refractive-index mirror layers in order to establish the low refractive index. Addition of the dopant may then be dispensed with when growing the high-refractive-index mirror layers. In this case, as a result of diffusion processes, a dopant concentration of at least $10^{18}$ cm$^{-3}$ is established in the high-refractive-index mirror layers, which is ideal with regard to a particularly large refractive index difference between adjacent high-refractive-index and low-refractive-index mirror layers.

The invention is described below with reference to figures and exemplary embodiments. The latter may also be applied in combination.

Figure 6:
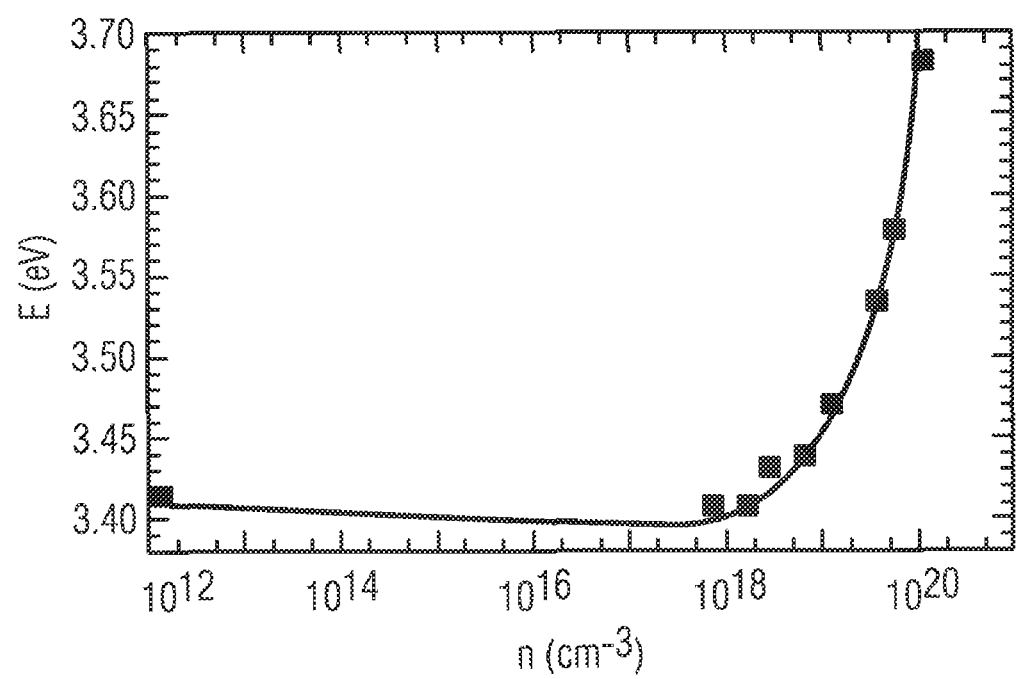

In the figures:

FIG. 1 is a schematic representation of a first exemplary embodiment of a light-emitting semiconductor device described here or of a light-emitting semiconductor component described here, namely an LED structure with a lower, first mirror, FIG. 2 is a schematic representation of a second exemplary embodiment of a light-emitting semiconductor device described here or of a light-emitting semiconductor component described here, namely a modified LED according to FIG. 1, but with an upper tunnel contact, FIG. 3 is a schematic representation of a third exemplary embodiment of a light-emitting semiconductor device described here or of a light-emitting semiconductor component described here, namely an improved vertical LED or a vertical laser, FIG. 4 is a schematic representation of a fourth exemplary embodiment of a light-emitting semiconductor device described here or of a light-emitting semiconductor component described here, namely a structure as in FIG. 3, but with a converter layer at a distance from the LED or the vertical laser, FIG. 5A is a schematic representation of a fifth exemplary embodiment of a light-emitting semiconductor device described here or of a light-emitting semiconductor component described here, namely contacting of a structure as in FIG. 2 after processing and FIG. 5B is a schematic representation of a sixth exemplary embodiment of a light-emitting semiconductor device described here or of a light-emitting semiconductor component described here, namely a structure with an additional upper mirror and contacting through the mirror, FIG. 6 is a graph plot for explaining one aspect of exemplary embodiments of a light-emitting semiconductor device described here.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

FIG. 1 shows a first exemplary embodiment of a light-emitting semiconductor device described here or of a light-emitting semiconductor component described here, namely a simple LED structure with a lower, first mirror 102.

100 is here the substrate, 101 an optional buffer layer, 102 the first mirror, in the form of a Bragg-mirror with x layer pairs (x: integer or integer ±0.5) of low- and high-refractive-index material, and 103 a usually n-conductive first conductive layer around the light-emitting layer sequence 104, in this case having by way of example three layers, ideally located at a maximum of the electrical field strength of the optical wave. The layer pairs need not necessarily be integral, the value possibly also being half-integral depending on the start or end of the layer sequence. The layer pairs here in each case comprise a high-refractive-index mirror layer 102a and a low-refractive-index mirror layer 102b.

The substrate 100 may be a growth substrate for the following layers, onto which said layers are epitaxially deposited. It is furthermore possible for the substrate 100 to be a carrier which does not correspond to the original growth substrate. In this case, the growth substrate can be detached and the remaining, epitaxially deposited layers fastened to substrate 100. The substrate 100 may in this case in particular designed to be electrically conductive.

The light-emitting layer sequence 104 comprises group III-nitride semiconductors which ideally have a smaller band gap than the surrounding material, thus for example not only InGaN in a GaN matrix, but also InGaN in an InGaN matrix with a lower In content. The material's band gap should be located in the visible or ultraviolet region of the spectrum. The number here depends on the design of the LED, with one to ten such layers, usually between 2-5 nm thick and separated by a barrier layer which is typically of a thickness of between 5 nm and 15 nm, being considered advantageous.

The barriers may, however, also be thicker in order to place each light-emitting layer at the maximum of the electrical field amplitude of the optical wave. In order to ensure optimum current injection into the light-emitting layers, as many as possible such layers should be placed within an individual amplitude maximum.

An electron barrier, not shown here, may be introduced above the light-emitting layers. For example, in a GaN-based LED, an Mg-doped AlGaN layer with a thickness of 5-25 nm and an Al content of between 5-30% prevents electron injection into the following layer 105. 105 is typically a p-doped second conductive layer for hole injection into the layers 104. Above this layer or a partially or completely transparent contacting layer (not shown here), the luminescence converter 106, which converts the light arising in the light-emitting layer sequence 104 entirely or in part into for example longer-wave light, may then be applied. At high beam intensities, conversion to shorter wavelengths, for example using frequency multiplication material, is also possible. In this example, light is preferably emitted in the direction of the arrow indicated above the structure.

FIG. 2 shows a second exemplary embodiment of a light-emitting semiconductor device described here or of a light-emitting semiconductor component described here, namely a modified LED like that in FIG. 1, but with an upper tunnel contact 208 through a highly n-doped layer 207. Simpler contacting and better current distribution of the upper contact is consequently possible. The other reference signs follow FIG. 1, but beginning with a 2 instead of with a 1. In this case, an MQW structure deposited on the layer 207 may serve as a converter 206 for converting some of the electrically generated light into longer-wave light.

FIG. 3 shows a third exemplary embodiment of a light-emitting semiconductor device described here or of a light-emitting semiconductor component described here, namely an improved vertical LED or a vertical laser. Thanks to an upper, second mirror 309 with y mirror pairs, wherein y is <x and y is an integer or an integer ±0.5, and the cavity 303-305 with an optical thickness which corresponds to an integral multiple of half the wavelength, and active layers, that is to say the light-emitting layer sequence 304, therein, a narrower emission spectrum is obtained and it is thus also possible, given appropriately high currents, to produce a VCSEL (vertical-cavity surface-emitting laser). The second mirror 309 is here ideally also made from the same material or a material from the same class of materials (AlInGaN) as the lower, first mirror 302.

With a highly n-doped layer 307 as the lower, low-refractive-index mirror layer 309a on the p-doped layer 305, it is then possible to produce a tunnel contact 308 similar to that shown in FIG. 2. The other reference signs again follow the preceding drawings. In principle, the upper, second mirror 309 may also be produced with other, even nonconductive materials, which, as a result of the larger jump in refractive index which is then usually available, only requires a few mirror pairs. In particular, a tunnel contact similar to that in FIG. 2 is then advantageous for the upper contact layer.

In the case of upward emission, thus in the direction of the arrow, the upper, second mirror 309 is generally less reflective than the lower, in order to maximize the stream of photons in the direction of the luminescence-converting layer, the converter 306, and not emit it unused in the other direction. In all the examples shown, the doping sequence, and thus also contacting, can in principle be reversed, that is to say the np junction may also be a pn-junction. All the examples may also be produced such that emission is towards the substrate. The latter may in principle also be removed or, after growth, be changed over to another carrier by rebonding. In this case, mirror reflectivity must be adapted to the other direction of emission.

FIG. 4 shows a fourth exemplary embodiment of a light-emitting semiconductor device described here or of a light-emitting semiconductor component described here, namely a structure as in FIG. 3, but with a converter 406, in particular as a layer which is not directly on the structure or the upper contacting layer, but instead at a certain distance 410, which may be defined for example by a cavity or a further material such as a transparent silicone or a polymer. Heat can consequently be kept away from the converter and, depending on the embodiment, it is also possible to change or dispense with converter layers.

FIG. 5A shows a fifth exemplary embodiment of a light-emitting semiconductor device described here or of a light-emitting semiconductor component described here, namely contacting of a structure as in FIG. 2 after processing. In this case, a circuit is produced by means of metalized coatings 511 and 513, which may be identical when an upper tunnel contact is used, with a wire 510 and 512 and a power supply (not shown), which circuit causes the device or the layers 504 in FIG. 2 to electroluminesce. The electroluminescence is then converted in the converter 506 entirely or in part into another wavelength.

FIG. 5B shows a sixth exemplary embodiment of a light-emitting semiconductor device described here or of a light-emitting semiconductor component described here, namely a structure with an additional upper, second mirror 509 and contacting through the mirror which ideally contains a p-n-tunnel contact, as shown in FIGS. 3 and 4 and designated 308 and 408. 523 is here the upper contact metal and 522 the upper connecting wire to a power source. In this example, the back contact is contacted, providing the substrate is conductive, via a metalized coating 521 on the back and a wire 520. It is in principle also possible to use a conductive oxide or a transparent conductive material, such as for example indium-tin oxide, instead of metal.

The graph plot of FIG. 6 shows the Borstein-Moss shift in bandgap energy E towards higher energies as a function of dopant concentration n. The dopant used here is germanium in GaN layers. The refractive index of the doped layers behaves reciprocally to the energy of the band gap, that is to say, the greater the energy of the band gap, the smaller is the refractive index. It is apparent from FIG. 6 that, counterintuitively, the band gap is not at its lowest in the undoped case, but instead has a minimum in the region of a dopant concentration of $10^{18}$ cm$^{-3}$. The refractive index is therefore at its maximum in the region of a dopant concentration of $10^{18}$ cm$^{-3}$, such that a maximum refractive index difference between the low-refractive-index and high-refractive-index mirror layers may be achieved with a dopant concentration of $10^{18}$ cm$^{-3}$ in the highly doped layer.

The examples shown here, or sub-aspects thereof, may be combined with one another as desired. In particular, the description made with reference to the exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS

100, 200, 300, 400, 500 Substrate
101, 201, 301, 401, 501 Buffer layer
102, 202, 302, 402, 502 First mirror
102a, 202a, 302a, 402a, 502a High-refractive-index mirror layers
102b, 202b, 302b, 402b, 502b Low-refractive-index mirror layers
103, 203, 303, 403, 503 First conductive layer
104, 204, 304, 404, 504 Light-emitting layer sequence
105, 205, 305, 405, 505 Second conductive layer
106, 206, 306, 406, 506 Converter
207, 307, 407, 507 Highly n-doped layer
208, 308, 408, 508 Tunnel contact
309, 409 Second mirror
309a, 409a High-refractive-index mirror layers
309b, 409b Low-refractive-index mirror layers
410 Distance
510 Wire
511 Metalized coating
512 Wire
513 Metalized coating
520 Wire
521 Metalized coating
522 Contact metal
523 Contact metal

The invention claimed is:

1. A light-emitting semiconductor device having
a first mirror,
a first conductive layer,
a light-emitting layer sequence on a side of the first conductive layer remote from the first mirror, and
a second conductive layer on a side of the light-emitting layer sequence remote from the first conductive layer, wherein
the first mirror, the first conductive layer, the light-emitting layer sequence and the second conductive layer are based on a III-nitride compound semiconductor material,
the first mirror is electrically conductive, and
the first mirror is a periodic sequence of homoepitaxial materials having a same composition with differing refractive indices,
wherein the first mirror comprises a periodic sequence of high refractive-index mirror layers and low-refractive-index mirror layers, wherein the high-refractive-index mirror layers and the low-refractive-index mirror layers differ from one another by the concentration of a dopant,
in which a further dopant which differs from the dopant is introduced at an interface between a low-refractive-index mirror layer and a high-refractive-index mirror layer.

2. The light-emitting semiconductor device according to claim 1, in which the high-refractive-index mirror layers and the low-refractive-index mirror layers have the same dopant.

3. The light-emitting semiconductor device according to claim 2, in which the low-refractive-index mirror layers have a dopant concentration of at least $2\times10^{19}$ cm$^{-3}$ and the high-refractive-index mirror layers a dopant concentration of less than $1\times10^{19}$ cm$^{-3}$.

4. The light-emitting semiconductor device according to claim 1, having a second mirror on a side of the second conductive layer remote from the light-emitting layer sequence, wherein the second mirror is formed with at least one of the following materials: semiconductor, insulator, metal.

5. The light-emitting semiconductor device according to claim 4, wherein the second mirror comprises a smaller number of mirror layers than the first mirror and the reflectivity of the second mirror is lower than the reflectivity of the first mirror.

6. The light-emitting component having
at least one light-emitting semiconductor device according to claim 1, and
a converter which is arranged downstream of the at least one light-emitting semiconductor device.

* * * * *